United States Patent
Wei (10) Patent No.: US 11,242,243 B2
(45) Date of Patent: Feb. 8, 2022

(54) MEMS CHIP AND ELECTRICAL PACKAGING METHOD FOR MEMS CHIP

(71) Applicant: HUAWEI TECHNOLOGIES CO., LTD., Guangdong (CN)

(72) Inventor: Yuming Wei, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 132 days.

(21) Appl. No.: 16/657,432

(22) Filed: Oct. 18, 2019

(65) Prior Publication Data

US 2020/0048076 A1    Feb. 13, 2020

Related U.S. Application Data

(63) Continuation of application No. PCT/CN2018/082295, filed on Apr. 9, 2018.

(30) Foreign Application Priority Data

Apr. 21, 2017   (CN) .......................... 201710267612.0

(51) Int. Cl.
| | | |
|---|---|---|
| *B81B 7/02* | (2006.01) | |
| *B81B 7/00* | (2006.01) | |
| *B81C 1/00* | (2006.01) | |

(52) U.S. Cl.
CPC .............. *B81B 7/02* (2013.01); *B81B 7/0064* (2013.01); *B81C 1/00261* (2013.01); *B81B 2201/042* (2013.01); *B81C 2203/01* (2013.01)

(58) Field of Classification Search
CPC .......................... B81B 7/02; B81B 2201/0053
See application file for complete search history.

(56) References Cited

U.S. PATENT DOCUMENTS

| 6,396,976 B1 | 5/2002 | Little et al. |
|---|---|---|
| 6,445,846 B2 | 9/2002 | Lin |
| (Continued) | | |

FOREIGN PATENT DOCUMENTS

| CN | 1555339 | 12/2004 |
|---|---|---|
| CN | 1637457 A | 7/2005 |
| (Continued) | | |

OTHER PUBLICATIONS

International Search Report for PCT/CN2018/082295 dated Jul. 13, 2018, 4 pages.

*Primary Examiner* — Moazzam Hossain (57) ABSTRACT

Embodiments of the application provide a MEMS chip and an electrical packaging method for a MEMS chip. The MEMS chip includes a MEMS device layer, a first isolating layer located under the MEMS device layer, and a first conducting layer located under the first isolating layer. At the first isolating layer, there are a corresponding quantity of first conductive through holes in locations corresponding to conductive structures in a first region and in locations corresponding to electrodes in a second region. At the first conducting layer, there are M electrodes spaced apart from one another, and the M electrodes are respectively connected to M of the first conductive through holes. At the first conducting layer, electrodes in locations corresponding to at least some of the conductive structures in the first region are electrically connected in a one-to-one correspondence to electrodes in locations corresponding to at least some of the electrodes in the second region.

14 Claims, 8 Drawing Sheets

(56) References Cited

U.S. PATENT DOCUMENTS

| | | |
|---|---|---|
| 8,569,164 B2 | 10/2013 | Park et al. |
| 2003/0122206 A1* | 7/2003 | Bhattarai ............ G02B 26/0841 |
| | | 257/415 |
| 2005/0152639 A1 | 7/2005 | Lee et al. |
| 2005/0206986 A1 | 9/2005 | Akagawa et al. |
| 2006/0233487 A1 | 10/2006 | Soneda et al. |
| 2008/0128886 A1 | 6/2008 | Kang et al. |
| 2010/0006999 A1* | 1/2010 | Shiozaki ............ H01L 21/02274 |
| | | 257/678 |
| 2013/0100145 A1 | 4/2013 | Zhong et al. |
| 2014/0151823 A1 | 6/2014 | Chou |
| 2015/0076923 A1* | 3/2015 | Frankel .................. H04Q 11/00 |
| | | 307/113 |
| 2017/0233246 A1 | 8/2017 | Kanamaru et al. |

FOREIGN PATENT DOCUMENTS

| | | |
|---|---|---|
| CN | 1847916 | 10/2006 |
| CN | 101628705 B | 10/2012 |
| CN | 103890635 A | 6/2014 |
| WO | 2016038984 | 3/2016 |

\* cited by examiner

MEMS CHIP AND ELECTRICAL PACKAGING METHOD FOR MEMS CHIP

CROSS-REFERENCE TO RELATED APPLICATIONS

This application is a continuation of International Application No. PCT/CN2018/082295, filed on Apr. 9, 2018, which claims priority to Chinese Patent Application No. 201710267612.0, filed on Apr. 21, 2017. The disclosures of the aforementioned applications are hereby incorporated by reference in their entireties.

TECHNICAL FIELD

This application relates to the field of semiconductor element packaging technologies, and in particular, to a micro-electro-mechanical system (MEMS) chip and an electrical packaging method for a MEMS chip.

BACKGROUND

We encounter many chips with various functions in our daily lives. "Chip" is a general term for semiconductor element products. A chip typically needs to be electrically packaged before being used. Electrical packaging means connecting an electrode in the chip to a Printed Circuit Board (PCB), to electrically connect the chip to a drive circuit, so as to allow external control over the chip.

A MEMS chip is characterized in that there are movable structures on a surface of the chip, and therefore the surface of the chip cannot be covered by another material lest the movable structures be damaged. MEMS chips include micromirror MEMS chips and MEMS-SOI (Silicon on Insulator, SOI) chips. Each micromirror unit included in a micromirror MEMS chip is relatively large in size (e.g., in millimeters), and generally, a quantity of micromirror units on a given chip is relatively small (e.g., in hundreds). An electrical packaging method for the micromirror MEMS chip includes the following: A dust cover is placed on the micromirror MEMS chip. Then, a drive of each micromirror unit is connected to a specific drive electrode through electric wiring on a surface of the micromirror MEMS chip, and the corresponding drive electrode is connected to a PCB. Then, the dust cover is removed. This dust cover process is used to prevent damage to the movable structures by a particle generated in the electrical packaging process.

However, each unit included in a MEMS-SOI chip is generally quite small in size (e.g., in hundreds of micrometers), and because of the restriction of a MEMS-SOI chip fabrication process, electric wiring cannot be applied on a surface of the MEMS-SOI chip. A drive electrode of each MEMS-SOI unit typically lies next to the unit, and drive electrodes are distributed among the movable structures. Therefore, the foregoing conventional electrical packaging method for the micromirror MEMS chip is totally unusable for the MEMS-SOI chip. There is an urgent need to implement new solutions for electrical packaging of the MEMS-SOI chips.

SUMMARY

Example embodiments of this application provide a MEMS chip and an electrical packaging method for a MEMS chip, to provide a solution for implementing electrical packaging of a MEMS-SOI chip.

A first aspect of the embodiments of this application provides a MEMS chip, where the MEMS chip includes a MEMS device layer, a first isolating layer, and a first conducting layer. The MEMS device layer includes a first region and at least one second region. The first region includes MEMS movable structures and conductive structures, the conductive structures are distributed among the MEMS movable structures, the second region is an electrode arrangement region. On an upper surface of the MEMS chip, the conductive structures in the first region are electrically isolated from electrodes in the second region. The first isolating layer is located under the MEMS device layer, and at the first isolating layer, a corresponding quantity of first conductive through holes are disposed in locations corresponding to the conductive structures in the first region and in locations corresponding to the electrodes in the second region. The first conducting layer is located under the first isolating layer, and the first conducting layer comprises M electrodes spaced apart from one another, and the M electrodes are respectively connected to M of the first conductive through holes, where M is a positive integer, and M is set based on a quantity of the conductive structures and a quantity of the electrodes in the second region. At the first conducting layer, electrodes in locations corresponding to at least some of the conductive structures in the first region are electrically connected in a one-to-one correspondence to electrodes in locations corresponding to at least some of the electrodes in the second region.

The first isolating layer and the first conducting layer are arranged in sequence under the MEMS device layer. At the first isolating layer, a corresponding quantity of first conductive through holes are disposed in the locations corresponding to the conductive structures in the first region and in the locations corresponding to the electrodes in the second region. The first conducting layer comprises the M electrodes that are spaced apart from one another and respectively connected to M of the first conductive through holes, so that the conductive structures in the first region are electrically connected to the electrodes in the second region in a "one-to-one correspondence". In this way, at the MEMS device layer, the conductive structures in the first region are led in a "one-to-one correspondence" to the second region, implementing electrical packaging of a MEMS-SOI chip. In addition, the first region is isolated from the to-be-packaged electrode arrangement region, and the MEMS movable structures in the first region can be protected by adding an isolating apparatus, so that electrical packaging of the MEMS-SOI chip can be compatible with a standard electrical packaging process, thereby helping to reduce costs.

In an example embodiment, the MEMS chip further includes an $N^{th}$ isolating layer located under the first conducting layer and an $N^{th}$ conducting layer located under the $N^{th}$ isolating layer, where N is a positive integer greater than or equal to 2. At the first conducting layer, in a region excluding the M electrodes, second conductive through holes are disposed and are connected to the first conductive through holes in a one-to-one correspondence, where M is less than a sum of the quantity of the conductive structures in the first region and the quantity of the electrodes in the second region. At the $N^{th}$ isolating layer, in locations corresponding to $(2N-2)^{th}$ conductive through holes, $(2N-1)^{th}$ conductive through holes are disposed and are connected to the $(2N-2)^{th}$ conductive through holes in a one-to-one correspondence. At the $N^{th}$ conducting layer, there are Q electrodes that are spaced apart from one another and connected to Q of the $(2N-1)^{th}$ conductive through holes, where Q is less than or equal to a quantity of the $(2N-1)^{th}$ conductive through holes. At the $N^{th}$ conducting layer, electrodes in locations corresponding to at least some of the conductive structures in the first region are electrically connected in a one-to-one correspondence to electrodes in locations corresponding to at least some of the electrodes in the second region.

A plurality of isolating layers and conducting layers are disposed to implement connection of all the conductive structures in the first region to the electrodes in the second region.

In an example embodiment, the first conducting layer comprises metal, polycrystalline silicon, or doped silicon, and the $N^{th}$ conducting layer is comprises metal, polycrystalline silicon, or doped silicon.

In another example embodiment, the MEMS device layer further includes an optical input/output region, and a high-reflectivity material is disposed in a location, at the first conducting layer, corresponding to the optical input/output region. Through disposition of the high-reflectivity material, a coupling loss of the optical input/output region can be reduced.

In yet another example embodiment, an isolating apparatus is disposed above the first region, a spacing between the electrodes in the second region is less than a first threshold, and copper pillar bumps are disposed on the conductive structures in the first region and the electrodes in the second region. This resolves a problem that packaging is difficult when there are quite a lot of conductive structures that need to be led out in the first region of the MEMS chip.

In certain example embodiments, the first threshold is 100 micrometers.

In certain example embodiments, an electrical switch chip is welded in the second region. This resolves a problem that packaging is difficult when there are quite a lot of conductive structures that need to be led out in the first region of the MEMS chip, and can reduce a quantity of electrodes that need to be welded to lead the MEMS chip to a PCB. A damaged electrical switch chip is easy to be replaced, and reliability of an electrical connection between the electrical switch chip and the MEMS chip is higher.

A second aspect of the embodiments of this application provides an electrical packaging method for a MEMS chip, where the MEMS chip includes a MEMS device layer, a first isolating layer, and a first conducting layer. The MEMS device layer includes a first region and at least one second region. The first region includes MEMS movable structures and conductive structures. The conductive structures are distributed among the MEMS movable structures, the second region is an electrode arrangement region, and on an upper surface of the MEMS chip, the conductive structures in the first region are electrically isolated from electrodes in the second region. The method includes:

arranging the first isolating layer and the first conducting layer in sequence under the MEMS device layer, wherein at the first isolating layer, a corresponding quantity of first conductive through holes are disposed in locations corresponding to the conductive structures in the first region and in locations corresponding to the electrodes in the second region. At the first conducting layer, M electrodes spaced apart from one another are disposed. The M electrodes are respectively connected to M of the first conductive through holes, where M is a positive integer. M is set based on a quantity of the conductive structures and a quantity of the electrodes in the second region; and electrically connecting, in a one-to-one correspondence at the first conducting layer, electrodes in locations corresponding to at least some of the conductive structures in the first region to electrodes in locations corresponding to at least some of the electrodes in the second region.

In certain example embodiments, the first isolating layer and the first conducting layer are arranged in sequence under the MEMS device layer. At the first isolating layer, a corresponding quantity of first conductive through holes are disposed in the locations corresponding to the conductive structures in the first region and in the locations corresponding to the electrodes in the second region. At the first conducting layer, the M electrodes are disposed that are spaced apart from one another and respectively connected to M of the first conductive through holes, so that at least some of the conductive structures in the first region are electrically connected to at least some of the electrodes in the second region in a "one-to-one correspondence". In this way, at the MEMS device layer, the conductive structures in the first region are led in a "one-to-one correspondence" to the second region, implementing electrical packaging of a MEMS-SOI chip. In addition, the first region is isolated from the to-be-packaged electrode arrangement region, and the MEMS movable structures in the first region can be protected by adding an isolating apparatus, so that electrical packaging of the MEMS-SOI chip can be compatible with a standard electrical packaging process, thereby helping to reduce costs.

In an example embodiment, M is less than a sum of the quantity of the conductive structures and the quantity of the electrodes in the second region. In the embodiment, the method further includes: arranging an $N^{th}$ isolating layer and an $N^{th}$ conducting layer in sequence under the first conducting layer, where N is a positive integer greater than or equal to 2, where, at the first conducting layer, in a region excluding the M electrodes, second conductive through holes are disposed that are connected to the first conductive through holes in a one-to-one correspondence. At the $N^{th}$ isolating layer, in locations corresponding to $(2N-2)^{th}$ conductive through holes, $(2N-1)^{th}$ conductive through holes are disposed that are connected to the $(2N-2)^{th}$ conductive through holes in a one-to-one correspondence; and at the $N^{th}$ conducting layer, Q electrodes are disposed that are spaced apart from one another and connected to Q of the $(2N-1)^{th}$ conductive through holes, where Q is less than or equal to a quantity of the $(2N-1)^{th}$ conductive through holes. The method further includes electrically connecting, in a one-to-one correspondence at the $N^{th}$ conducting layer, electrodes in locations corresponding to at least some of the conductive structures in the first region to electrodes in locations corresponding to at least some of the electrodes in the second region.

A plurality of isolating layers and conducting layers are disposed to implement connection of all the conductive structures in the first region to the electrodes in the second region.

In another example embodiment, the first conducting layer comprises metal, polycrystalline silicon, or doped silicon, and the $N^{th}$ conducting layer comprises metal, polycrystalline silicon, or doped silicon.

In yet another example embodiment, the MEMS device layer further includes an optical input/output region, and the method further includes: disposing a high-reflectivity material in a location, at the first conducting layer, corresponding to the optical input/output region. Through disposition of the high-reflectivity material, a coupling loss of the optical input/output region can be reduced.

DESCRIPTION OF NON-LIMITING EXAMPLE EMBODIMENTS

In the following description, for purpose of explanation, numerous specific details are set forth to provide a thorough understanding of the exemplary embodiments. It will be evident, however, to a person skilled in the art that the exemplary embodiments may be practiced without these specific details.

An optical switch matrix based on a MEMS-SOI chip has a very low loss, and therefore MEMS-SOI chips provide a great advantage when used in an optical switch system. A MEMS-SOI chip includes an optical switch matrix and an optical input (I)/output (0) region. The following briefly describes an example scenario of the optical switch matrix in which the present technology is useful.

Figure 1:
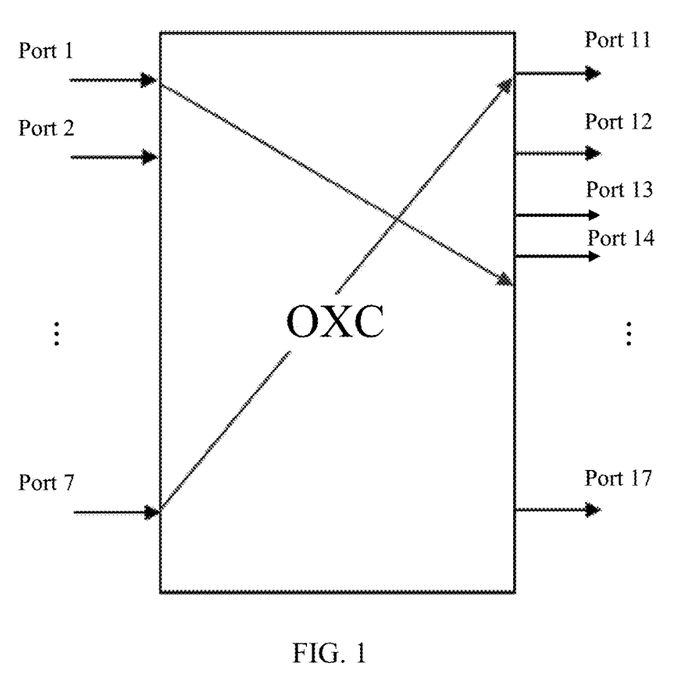
FIG. 1 is an example non-limiting schematic diagram of an optical cross-connect (OXC) routing function.

A basic function of a communications network is to send signals from different sources to specified destinations. FIG. 1 is a non-limiting example schematic diagram of an OXC routing function. As shown in FIG. 1, a signal of a first user is input to a port 1, and needs to be output to a destination from a port 14. A signal of a second user is input to a port 7, and needs to be output to a destination from a port 11. A unit that implements this routing function is referred to as an optical cross-connect (OXC), and a core device of the OXC is an optical switch matrix.

Figure 2:
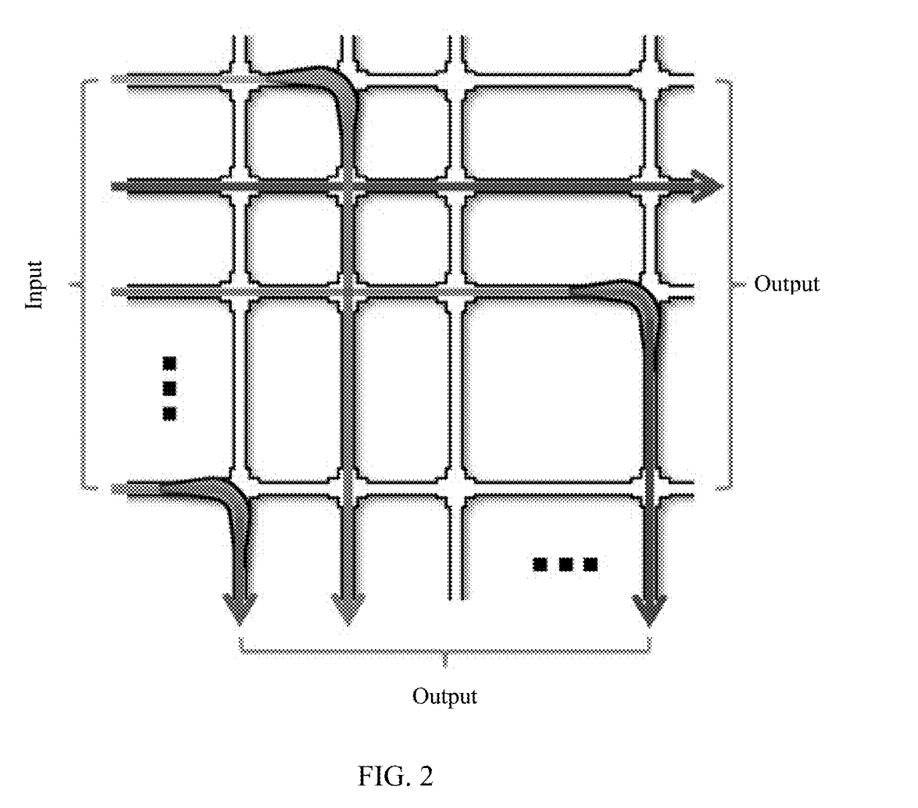
FIG. 2 is an example non-limiting schematic diagram of an architecture of an optical switch matrix.
Figure 3:
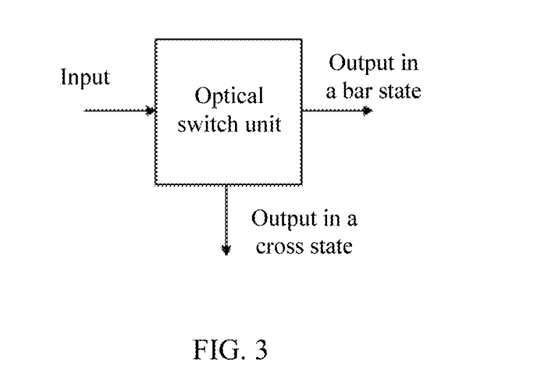
FIG. 3 is an example non-limiting schematic diagram of states of an optical switch unit.

FIG. 2 is a non-limiting example schematic diagram of an architecture of an optical switch matrix. This architecture is referred to as a cross-bar architecture. As shown in FIG. 2, the optical switch matrix includes a plurality of crosspoints in a crisscross pattern. Each crosspoint is an optical switch unit. FIG. 3 is a non-limiting example schematic diagram of states of an optical switch unit. As shown in FIG. 2 and FIG. 3, each crosspoint has two states: a bar state and a cross state. In the bar state, light is transmitted forward along a straight line. In the cross state, light is output after a 90-degree turn. It will be appreciated that routing from any input port to any output port can be implemented through controlling of the states of each crosspoint.

The optical switch unit includes upper-layer and lower-layer optical waveguides. The lower-layer optical waveguide forms a crisscross pattern, and is referred to as a bus waveguide, serving as a horizontal or vertical transmission line in the cross-bar architecture. The upper-layer optical waveguide forms a 90-degree turn, and is referred to as a shunt waveguide. An operating principle of the optical switch unit is as follows: when the optical switch unit is powered off, the upper-layer shunt waveguide does not affect the lower-layer bus waveguide in any way, an optical signal is restricted to be transmitted in the bus waveguide, and the optical switch unit is in the "bar state"; when the optical switch unit is powered on, electric potentials of the upper-layer and lower-layer optical waveguides are different, and under influence of an "electrostatic attraction force", two arms of the upper-layer shunt waveguide are pulled down, and at this time, the optical signal in the lower-layer optical waveguide is coupled to the shunt waveguide, and the optical switch unit is in the "cross state". Because the two arms of the optical waveguide are movable, the two arms of the optical waveguide are implemented as a MEMS movable mechanical structure.

Compared with other architectures, the cross-bar architecture has a great advantage: a very low loss. Currently, loss performance has become a bottleneck that restricts development of optical switch matrices. Therefore, the advantage of the cross-bar architecture is especially impressive. However, it will be understood that the cross-bar architecture also has a disadvantage, that is, a large quantity of switches. An N×N optical switch matrix has a total of N×N optical switch units. This means that there are a large quantity of drive electrodes in the optical switch matrix, or in other words, there are a large quantity of drive electrodes in the MEMS-SOI chip. For the MEMS-SOI chip, a conventional electrical packaging method for a micromirror MEMS chip is totally unusable. How to implement electrical packaging of the MEMS-SOI chip is a concern of the embodiments of this application. The following describes example technical solutions in detail with reference to the accompanying drawings.

Figure 4:
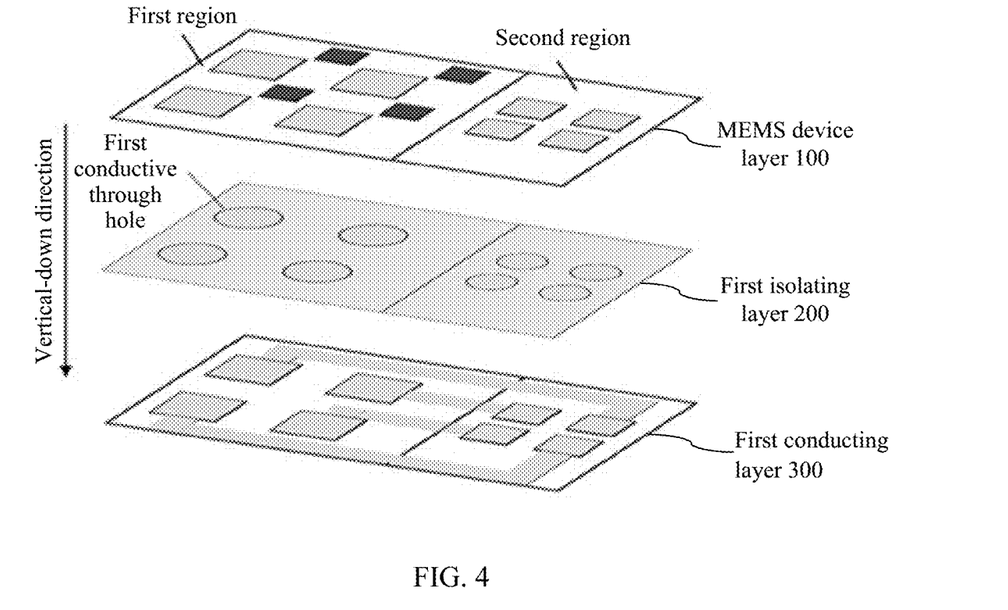
FIG. 4 is an example non-limiting schematic structural diagram in perspective exploded view of layers of an embodiment of a MEMS chip according to one or more example embodiments.
Figure 5:
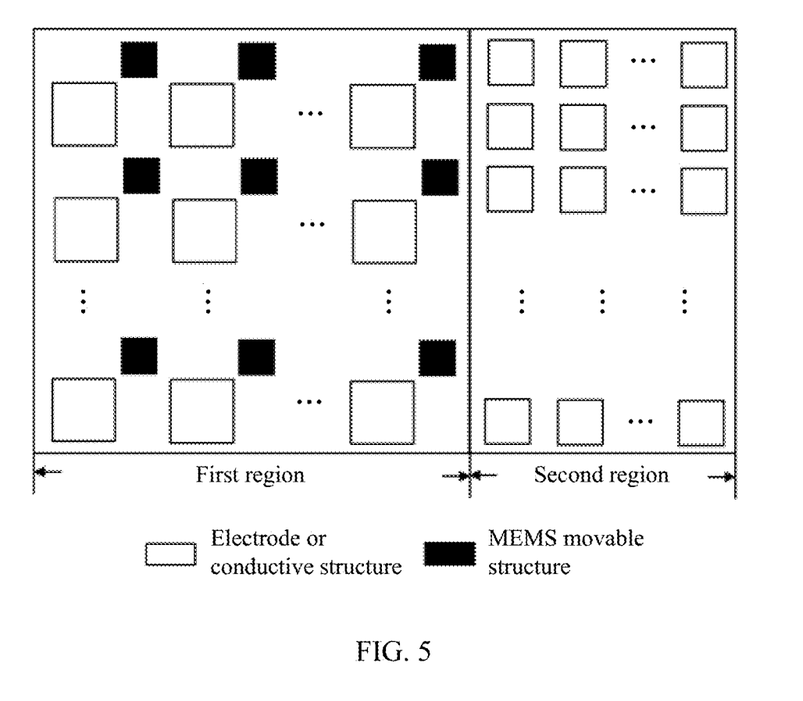
FIG. 5 is an example non-limiting schematic structural diagram in plan view of a MEMS device layer according to one or more example embodiments.
Figure 6:
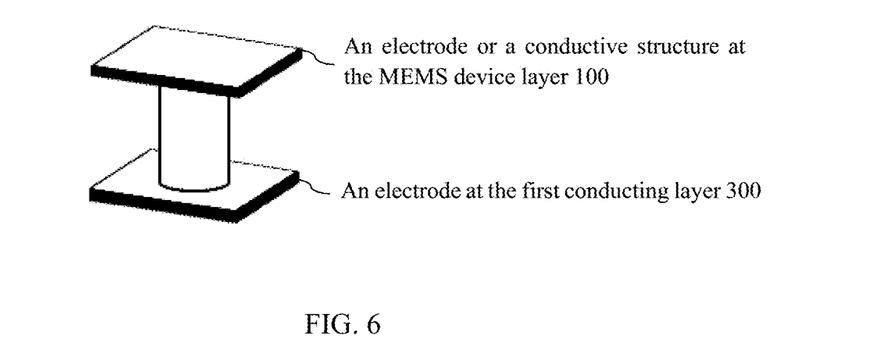
FIG. 6 is an example non-limiting side perspective view of a conductive through hole according to one or more example embodiments.

FIG. 4 is an example non-limiting schematic structural diagram of a MEMS chip according to one or more example embodiments, and FIG. 5 is an example non-limiting schematic structural diagram of a MEMS device layer according to one or more example embodiments. As shown in FIG. 4 and FIG. 5, the MEMS chip includes a MEMS device layer 100, a first isolating layer 200, and a first conducting layer 300. The MEMS device layer 100 includes a first region and at least one second region. The first region includes MEMS movable structures (shown schematically as filled squares) and conductive structures (shown schematically as unfilled squares). The conductive structures are also referred to as drive electrodes. The conductive structures may be made of a material such as electrode, polycrystalline silicon, or doped silicon. The conductive structures are distributed among adjacent MEMS movable structures. The second region is an electrode arrangement region, and on an upper surface of the MEMS chip, the MEMS device layer electrically isolates the conductive structures in the first region from electrodes in the second region. The first isolating layer 200 is located under the MEMS device layer 100, and at the first isolating layer 200, there are a corresponding quantity of first conductive through holes (shown schematically as unfilled circles) in locations corresponding to the conductive structures in the first region and in locations corresponding to the electrodes in the second region. The first conductive through holes are not electrically connected to each other. The first conductive through holes may be metal through holes, or may be cylindrical metal through holes. FIG. 6 is an example non-limiting perspective illustration of a conductive through hole according to one or more example embodiments. As shown in FIG. 6, an upper surface of the conductive through hole is connected to an electrode or a conductive structure at the MEMS device layer 100, and a lower surface of the conductive through hole is connected to an electrode at the first conducting layer 300. At the first isolating layer 200, a region excluding the first conductive through holes is made of an electrically insulating material. The electrically insulating material is transparent to an optical signal in communications bands at wavelengths around 1550 nm and 1310 nm. For example, the electrically insulating material is silicon dioxide, silicon nitride, or the like, and a thickness of the material is in micrometers. A purpose of using the first isolating layer 200 is to implement connection of the electrodes or the conductive structures at the MEMS device layer 100 to electrodes at the first conducting layer 300, and to implement complete electrical isolation in regions excluding the electrodes. The first conducting layer 300 is located under the first isolating layer 200. At the first conducting layer 300, there are M electrodes spaced apart from one another, and the M electrodes are respectively connected to M of the first conductive through holes. M is a positive integer, and M is set based on a quantity of the conductive structures in the first region and a quantity of the electrodes in the second region. When the quantity of the conductive structures and the quantity of the electrodes in the second region are relatively small, only one conducting layer needs to be disposed. In this case, M is equal to a sum of the quantity of the conductive structures and the quantity of the electrodes in the second region. When the quantity of the conductive structures and the quantity of the electrodes in the second region are relatively large, a plurality of conducting layers need to be disposed, and M is less than the sum of the quantity of the conductive structures and the quantity of the electrodes in the second region.

At the first conducting layer 300, electrodes in locations corresponding to at least some of the conductive structures in the first region are electrically connected in a one-to-one correspondence to electrodes in locations corresponding to at least some of the electrodes in the second region. Electrical connection in a one-to-one correspondence means: at the first conducting layer 300, the electrodes corresponding to the first region are electrically connected in a one-to-one manner to the electrodes corresponding to the second region. Electrical connection may be implemented through electric wiring. At the first conducting layer 300, a region excluding the electrodes is filled with an electrically insulating material. The first conducting layer 300 may be made of metal, polycrystalline silicon, or doped silicon.

In this example embodiment, the first isolating layer 200 is used to implement electrical connections, in a "one-to-one correspondence", of at least some of the electrodes and the conductive structures at the MEMS device layer 100 to at least some of the electrodes at the first conducting layer 300. In addition, via electric wiring at the first conducting layer 300, at least some of the conductive structures in the first region are connected to the corresponding electrodes in the second region in a "one-to-one correspondence". In this way, the conductive structures in the first region of the MEMS device layer are led to the second region in a "one-to-one correspondence". The first region is isolated from the to-be-packaged electrode arrangement region (the second region). An isolating apparatus (for example, a dust cover) may be disposed above the first region to protect the MEMS movable structures from being damaged by an electrical packaging process. After the to-be-packaged electrode arrangement region is isolated from the MEMS movable structures, electrical packaging of the MEMS chip can be compatible with a standard electrical packaging process, thereby helping to reduce product costs. A standard CMOS process may be used for making the metal and electric wiring under the MEMS movable structures.

Figure 7:
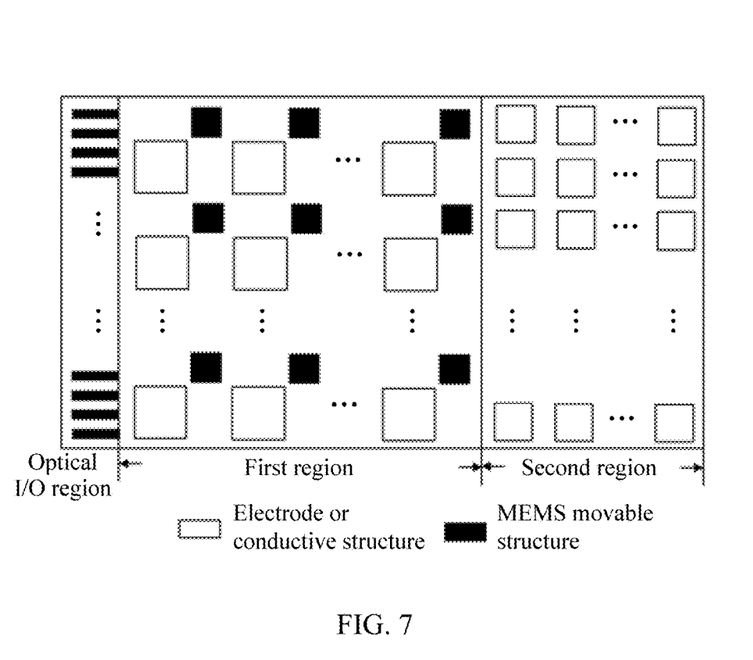
FIG. 7 is an example non-limiting schematic structural diagram in plan view of another embodiment of a MEMS chip according to one or more example embodiments.

FIG. 7 is an example non-limiting schematic structural diagram of another embodiment of the MEMS chip according to one or more example embodiments. Based on the foregoing embodiments, further, the upper surface of the MEMS chip further includes an optical input/output (I/O) region, and there is a high-reflectivity material in a location, at the first conducting layer, corresponding to the optical input/output region. The high-reflectivity material is, for example, metal. Through disposition of the high-reflectivity material, a coupling loss of the optical input/output region can be reduced.

According to the MEMS chip provided in this embodiment, the first isolating layer and the first conducting layer are arranged in sequence under the MEMS device layer; at the first isolating layer, there are a corresponding quantity of first conductive through holes in the locations corresponding to the conductive structures in the first region and in the locations corresponding to the electrodes in the second region; and at the first conducting layer, the M electrodes are disposed that are spaced apart from one another and respectively connected to M of the first conductive through holes, so that M of the conductive structures in the first region are electrically connected to M of the electrodes in the second region in a "one-to-one correspondence". In this way, at the MEMS device layer, the conductive structures in the first region are led in a "one-to-one correspondence" to the second region, thereby implementing electrical packaging of a MEMS-SOI chip. In addition, the first region is isolated from the to-be-packaged electrode arrangement region, and the MEMS movable structures in the first region can be protected by adding an isolating apparatus, so that electrical packaging of the MEMS-SOI chip can be compatible with a standard electrical packaging process, thereby helping to reduce costs.

Based on the foregoing embodiments, when there are quite a lot of conductive structures in the first region, one conducting layer may not be able to lead out all the conductive structures in the first region, and a second isolating layer, a second conducting layer, . . . , an $N^{th}$ isolating layer, and an $N^{th}$ conducting layer need to be disposed, where N is a positive integer greater than or equal to 2. Through combination of these isolating layers and conducting layers, all the conductive structures in the first region are finally connected to the electrodes in the second region.

Figure 8:
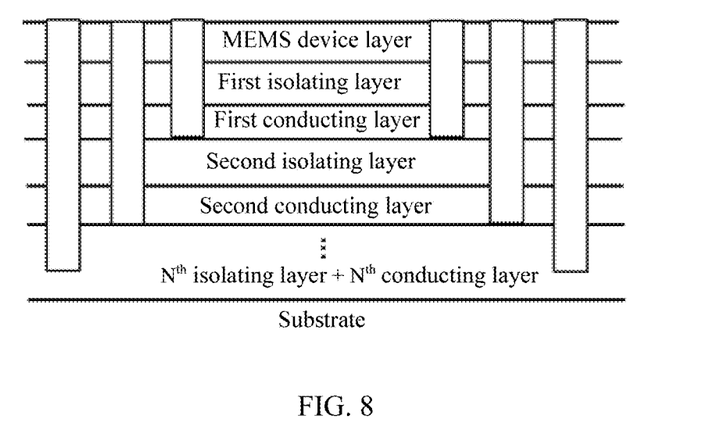
FIG. 8 is an example non-limiting schematic cross-sectional structural diagram of layers an embodiment of a MEMS chip according to one or more example embodiments.
Figure 9:
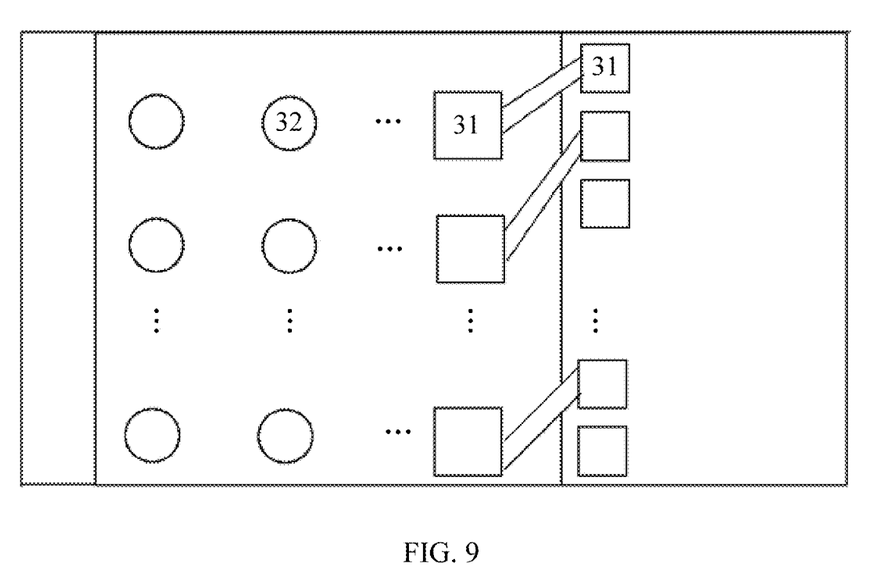
FIG. 9 is an example non-limiting schematic structural diagram in plan view of a first conducting layer according to one or more example embodiments.

Based on the foregoing embodiments, further, the MEMS chip may further include an $N^{th}$ isolating layer and an $N^{th}$ conducting layer that are arranged in alternating sequence under the first conducting layer, where N is a positive integer greater than or equal to 2. FIG. 8 is an example non-limiting schematic cross-sectional structural diagram of the MEMS chip according to one or more example embodiments. As shown in FIG. 8, the MEMS chip in this embodiment includes the MEMS device layer, the first isolating layer, the first conducting layer, the second isolating layer, the second conducting layer, . . . , the $N^{th}$ isolating layer, the $N^{th}$ conducting layer, and a substrate that are arranged in sequence. FIG. 9 is an example non-limiting schematic structural diagram of the first conducting layer according to one or more example embodiments. At the first conducting layer 300, in a region excluding the M electrodes 31, second conductive through holes 32 are disposed that are connected to the first conductive through holes in a one-to-one correspondence, where M is less than the sum of the quantity of the conductive structures and the quantity of the electrodes in the second region. There is a high-reflectivity material in a location, at the first conducting layer 300, corresponding to the optical input/output region. At the second isolating layer, in locations corresponding to the second conductive through holes 32, there are third conductive through holes connected to the second conductive through holes 32 in a one-to-one correspondence. At the second conducting layer, there are K electrodes that are spaced apart from one another and connected to K of the third conductive through holes, where K is less than or equal to a quantity of the third conductive through holes. At the $N^{th}$ isolating layer, in locations corresponding to $(2N-2)^{th}$ conductive through holes, there are $(2N-1)^{th}$ conductive through holes connected to the $(2N-2)^{th}$ conductive through holes in a one-to-one correspondence. At the $N^{th}$ conducting layer, there are Q electrodes that are spaced apart from one another and connected to Q of the $(2N-1)^{th}$ conductive through holes, and Q is less than or equal to a quantity of the $(2N-1)^{th}$ conductive through holes. If N is equal to 2, K and Q in this embodiment are the same. At the $N^{th}$ conducting layer, electrodes in locations corresponding to at least some of the conductive structures in the first region are electrically connected in a one-to-one correspondence to electrodes in locations corresponding to at least some of the electrodes in the second region. No high-reflectivity material is disposed in a location, at the $N^{th}$ conducting layer, corresponding to the optical input/output region. The $N^{th}$ conducting layer is made of metal, polycrystalline silicon, or doped silicon.

Optionally, a sum of quantities of electrodes in locations, at the first conducting layer to the $N^{th}$ conducting layer, corresponding to the conductive structures in the first region is greater than or equal to the quantity of the conductive structures in the first region of the MEMS chip, and a sum of quantities of electrodes in locations, at the first conducting layer to the $N^{th}$ conducting layer, corresponding to the electrodes in the second region is greater than or equal to the quantity of the electrodes in the second region of the MEMS chip. In other words, an idle electrode is allowed to exist.

In this embodiment, a plurality of isolating layers and conducting layers are disposed to implement connection of all the conductive structures in the first region to the electrodes in the second region.

Figure 10:
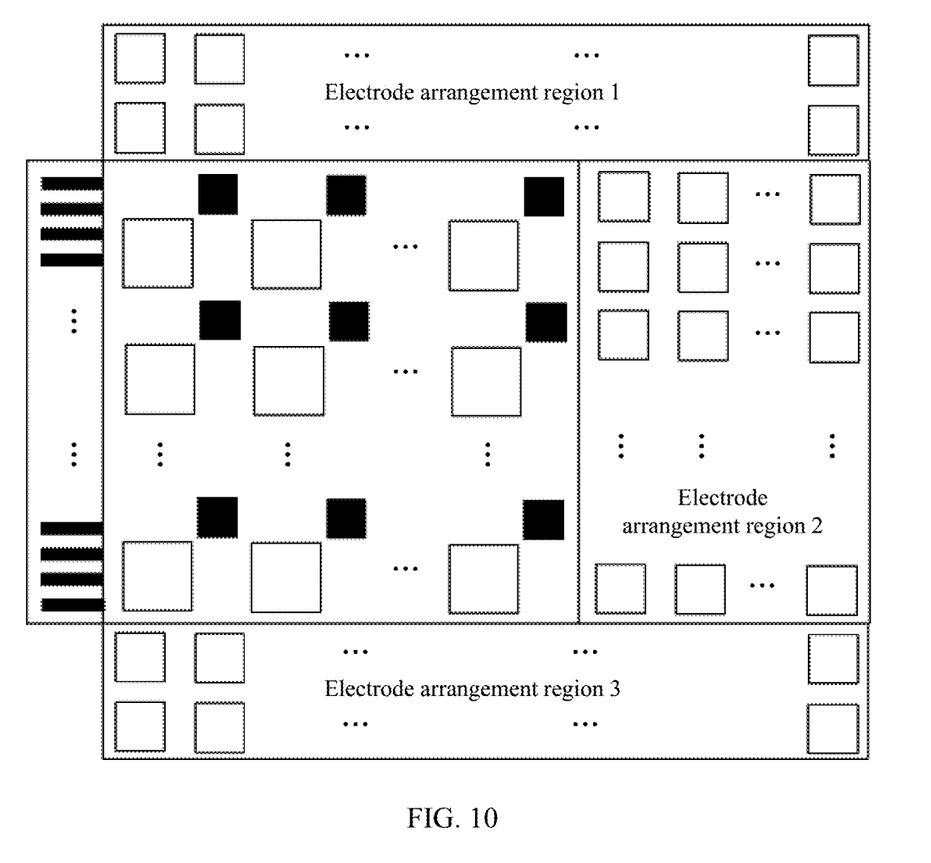
FIG. 10 is an example non-limiting schematic structural diagram in plan view of an embodiment of a MEMS device layer in still another MEMS chip according to one or more example embodiments.

FIG. 10 is an example non-limiting schematic structural diagram of a MEMS device layer in still another MEMS chip according to one or more example embodiments. Based on the foregoing embodiments, the MEMS device layer 100 includes a first region and a plurality of second regions. The second regions are electrode arrangement regions. As shown in FIG. 10, there may be a plurality of electrode arrangement regions, arranged in different locations of the MEMS chip, to facilitate electric wiring of the electrodes in various directions. Structures of the isolating layer and the conducting layer are the same as those in the foregoing embodiments, and details are not repeated herein.

Further, when there are quite a lot of (for example, more than 10 thousands) conductive structures that need to be led out in the first region of the MEMS chip, even if the conductive structures are led to the multiple electrode arrangement regions, packaging is relatively difficult. There are two example non-limiting implementable manners to resolve this problem. In one implementable manner, based on the foregoing embodiments, an isolating apparatus is disposed above the first region, a spacing between the electrodes in the second region is less than a first threshold, where the first threshold is, for example, 100 micrometers, and copper pillar bumps are disposed on the conductive structures and the electrodes in the second region.

In another implementable manner, based on the foregoing embodiments, an electrical switch chip is welded in the second region. For example, a 1×16 electrical switch chip is welded in the second region, and the 1×16 electrical switch chip is led to a PCB by using conventional electrical packaging technology. In this implementation, a quantity of electrodes that need to be welded to lead the MEMS chip to the PCB can be reduced, because only control signal electrodes of the welded 1×16 electrical switch chip need to be connected to the PCB. In this case, a damaged 1×16 electrical switch chip is easily replaced, and reliability of an electrical connection between the 1×16 electrical switch chip and the MEMS chip is higher.

Figure 11:
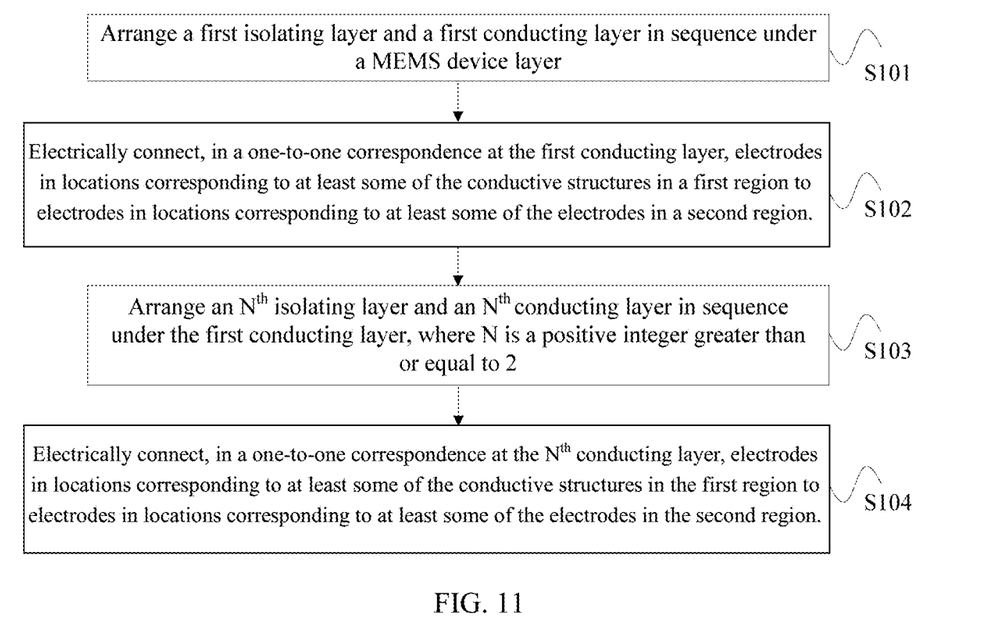
FIG. 11 is an example non-limiting schematic flowchart of an electrical packaging method for a MEMS chip according to one or more example embodiments.

FIG. 11 is an example non-limiting schematic flowchart of an electrical packaging method for a MEMS chip according to one or more example embodiments. The MEMS chip includes a MEMS device layer, a first isolating layer, and a first conducting layer. The MEMS device layer includes a first region and at least one second region. The first region includes MEMS movable structures and conductive structures. The conductive structures are distributed among the MEMS movable structures. The second region is an electrode arrangement region. On an upper surface of the MEMS chip, the conductive structures are electrically isolated from electrodes in the second region. As shown in FIG. 11, the method in this embodiment may include the following steps.

S101. Arrange the first isolating layer and the first conducting layer in sequence under the MEMS device layer.

At the first isolating layer, a corresponding quantity of first conductive through holes are disposed in locations corresponding to the conductive structures in the first region and in locations corresponding to the electrodes in the second region. At the first isolating layer, a region excluding (i.e., areas other than) the first conductive through holes is made of an electrically insulating material. At the first conducting layer, there are M electrodes spaced apart from one another, and the M electrodes are respectively connected to M of the first conductive through holes. M is a positive integer, and M is set based on a quantity of the conductive structures and a quantity of the electrodes in the second region. Optionally, the first conducting layer is made of metal, polycrystalline silicon, or doped silicon.

S102. Electrically connect, in a one-to-one correspondence at the first conducting layer, electrodes in locations corresponding to at least some of the conductive structures in the first region to electrodes in locations corresponding to at least some of the electrodes in the second region.

At the first conducting layer, a region excluding the electrodes is filled with an electrically insulating material.

Further, when M is less than a sum of the quantity of the conductive structures and the quantity of the electrodes in the second region, the method further includes the following steps.

S103. Arrange an $N^{th}$ isolating layer and an $N^{th}$ conducting layer in sequence under the first conducting layer, where N is a positive integer greater than or equal to 2.

At the first conducting layer, in a region excluding the M electrodes, a second conductive through holes are disposed that are connected to the first conductive through holes in a one-to-one correspondence. At the $N^{th}$ isolating layer, in locations corresponding to $(2N-2)^{th}$ conductive through holes, $(2N-1)^{th}$ conductive through holes are disposed that are connected to the $(2N-2)^{th}$ conductive through holes in a one-to-one correspondence. At the $N^{th}$ conducting layer, Q electrodes are disposed that are spaced apart from one another and connected to Q of the $(2N-1)^{th}$ conductive through holes, and Q is less than or equal to a quantity of the $(2N-1)^{th}$ conductive through holes.

S104. Electrically connect, in a one-to-one correspondence at the $N^{th}$ conducting layer, electrodes in locations corresponding to at least some of the conductive structures in the first region to electrodes in locations corresponding to at least some of the electrodes in the second region.

Optionally, the first conducting layer is made of metal, polycrystalline silicon, or doped silicon, and the $N^{th}$ conducting layer is made of metal, polycrystalline silicon, or doped silicon.

Further, the MEMS device layer further includes an optical input/output region, and the method in this embodiment further includes: disposing a high-reflectivity material in a location, at the first conducting layer, corresponding to the optical input/output region. Through disposition of the high-reflectivity material, a coupling loss of the optical input/output region can be reduced.

An implementation principle of the method in this embodiment is similar to that of the technical solution in the foregoing apparatus embodiments, and details are not repeated herein.

According to the electrical packaging method for the MEMS chip provided in this embodiment, the first isolating layer and the first conducting layer are arranged in sequence under the MEMS device layer; at the first isolating layer, there are a corresponding quantity of first conductive through holes in the locations corresponding to the conductive structures in the first region and in the locations corresponding to the electrodes in the second region; and at the first conducting layer, the M electrodes are disposed that are spaced apart from one another and respectively connected to M of the first conductive through holes, so that at least some of the conductive structures in the first region are electrically connected to the corresponding electrodes in the second region in a "one-to-one correspondence". In this way, at the MEMS device layer, the conductive structures in the first region are led in a "one-to-one correspondence" to the second region, implementing electrical packaging of a MEMS-SOI chip. In addition, the first region is isolated from the to-be-packaged electrode arrangement region, and the MEMS movable structures in the first region can be protected by adding an isolating apparatus, so that electrical packaging of the MEMS-SOI chip can be compatible with a standard electrical packaging process, thereby helping to reduce costs.

Persons of ordinary skill in the art may understand that all or some of the steps of the method embodiments may be implemented by a program instructing relevant hardware. The program may be stored in a non-transitory computer-readable storage medium. When the program runs, the steps of the method embodiments are performed. The foregoing storage medium includes any medium that can store program code, such as a ROM, a RAM, a magnetic disk, or an optical disc.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A MEMS chip, comprising a MEMS device layer, a first isolating layer, and a first conducting layer, wherein
   the MEMS device layer comprises a first region and at least one second region, the first region comprising MEMS movable structures and conductive structures, the conductive structures being distributed among the MEMS movable structures, the second region being an electrode arrangement region, and on an upper surface of the MEMS chip, the conductive structures in the first region being electrically isolated from electrodes in the second region;
   the first isolating layer is located under the MEMS device layer, and at the first isolating layer, a corresponding quantity of first conductive through holes are disposed in locations corresponding to the conductive structures in the first region and in locations corresponding to the electrodes in the second region;
   the first conducting layer is located under the first isolating layer, and the first conducting layer comprises M electrodes spaced apart from one another, the M electrodes being respectively connected to M of the first conductive through holes, M being a positive integer, and M being set based on a quantity of the conductive structures in the first region and a quantity of the electrodes in the second region; and
   at the first conducting layer, electrodes in locations corresponding to at least some of the conductive structures in the first region are electrically connected in a one-to-one correspondence to electrodes in locations corresponding to at least some of the electrodes in the second region.

2. The MEMS chip according to claim 1, wherein M is less than or equal to a sum of the quantity of the conductive structures in the first region and the quantity of the electrodes in the second region.

3. The MEMS chip according to claim 1, further comprising:
   a second isolating layer located under the first conducting layer and a second conducting layer located under the second isolating layer, wherein
   second conductive through holes are disposed at the first conducting layer, in a region excluding the M electrodes, the second conductive through holes being connected to the first conductive through holes in a one-to-one correspondence, M being less than a sum of the quantity of the conductive structures in the first region and the quantity of the electrodes in the second region;
   third conductive through holes are disposed at the second isolating layer, in locations corresponding to the second conductive through holes, the third conductive through holes being connected to the second conductive through holes in a one-to-one correspondence;
   the second conducting layer comprises Q electrodes that are spaced apart from one another and connected to Q of the third conductive through holes, Q being less than or equal to a quantity of the third conductive through holes; and
   at the second conducting layer, electrodes in locations corresponding to at least some of the conductive structures in the first region are electrically connected in a one-to-one correspondence to electrodes in locations corresponding to at least some of the electrodes in the second region.

4. The MEMS chip according to claim 3, further comprising:
a third isolating layer located under the second conducting layer and a third conducting layer located under the third isolating layer, wherein
fourth conductive through holes are disposed at the second conducting layer, in a region excluding the Q electrodes, the fourth conductive through holes being connected to the third conductive through holes in a one-to-one correspondence;
fifth conductive through holes are disposed at the third isolating layer, in locations corresponding to the fourth conductive through holes, the fifth conductive through holes being connected to the fourth conductive through holes in a one-to-one correspondence;
the third conducting layer comprises K electrodes that are spaced apart from one another and connected to K of the fifth conductive through holes, K being less than or equal to a quantity of the fifth conductive through holes; and
at the third conducting layer, electrodes in locations corresponding to at least some of the conductive structures in the first region are electrically connected in a one-to-one correspondence to electrodes in locations corresponding to at least some of the electrodes in the second region.

5. The MEMS chip according to claim 1, further comprising:
an $N^{th}$ isolating layer located under the first conducting layer and an $N^{th}$ conducting layer located under the $N^{th}$ isolating layer, wherein N is a positive integer greater than or equal to 2, wherein
second conductive through holes are disposed at the first conducting layer, in a region excluding the M electrodes, the second conductive through holes being connected to the first conductive through holes in a one-to-one correspondence, M being less than a sum of the quantity of the conductive structures and the quantity of the electrodes in the second region;
$(2N-1)^{th}$ conductive through holes are disposed at the $N^{th}$ isolating layer, in locations corresponding to $(2N-2)^{th}$ conductive through holes, the $(2N-1)^{th}$ conductive through holes being connected to the $(2N-2)^{th}$ conductive through holes in a one-to-one correspondence;
the $N^{th}$ conducting layer comprises Q electrodes that are spaced apart from one another and connected to Q of the $(2N-1)^{th}$ conductive through holes, Q being less than or equal to a quantity of the $(2N-1)^{th}$ conductive through holes; and at the $N^{th}$ conducting layer, electrodes in locations corresponding to at least some of the conductive structures in the first region are electrically connected in a one-to-one correspondence to electrodes in locations corresponding to at least some of the electrodes in the second region.

6. The MEMS chip according to claim 5, wherein a sum of quantities of electrodes in locations, at the first conducting layer to the $N^{th}$ conducting layer, corresponding to the conductive structures in the first region of the MEMS device layer is greater than or equal to the quantity of the conductive structures in the first region, and a sum of quantities of electrodes in locations, at the first conducting layer to the $N^{th}$ conducting layer, corresponding to the electrodes in the second region is greater than or equal to the quantity of the electrodes in the second region.

7. The MEMS chip according to claim 5, wherein the first conducting layer comprises metal, polycrystalline silicon, or doped silicon, and the $N^{th}$ conducting layer comprises metal, polycrystalline silicon, or doped silicon.

8. The MEMS chip according to claim 1, wherein the MEMS device layer further comprises an optical input/output region, and a high-reflectivity material is disposed in a location, at the first conducting layer, corresponding to the optical input/output region.

9. The MEMS chip according to claim 1, wherein an isolating apparatus is disposed above the first region, a spacing between the electrodes in the second region is less than a first threshold, and copper pillar bumps are disposed on the conductive structures in the first region and the electrodes in the second region.

10. The MEMS chip according to claim 9, wherein the first threshold is 100 micrometers.

11. The MEMS chip according to claim 1, wherein an electrical switch chip is welded in the second region.

12. The MEMS chip according to claim 1, wherein the conductive structures in the first region of the MEMS device layer comprise drive electrodes.

13. The MEMS chip according to claim 1, wherein the number of the first conductive through holes at the first isolating layer is larger than M.

14. The MEMS chip according to claim 1, wherein, for each of the M of the first conductive through holes at the first isolating layer, an upper surface of the first conductive through hole is connected to one of the conductive structures or one of the electrodes at the MEMS device layer, and a lower surface of the first conductive through hole is connected to one of the electrodes at the first conducting layer.

* * * * *